US005658826A

United States Patent [19]
Chung

[11] Patent Number: 5,658,826
[45] Date of Patent: Aug. 19, 1997

[54] METHOD FOR FABRICATING SEMICONDUCTOR DEVICE

[75] Inventor: Ki Woong Chung, Seoul, Rep. of Korea

[73] Assignee: LG Semicon Co., Ltd., Chungcheongbuk-do, Rep. of Korea

[21] Appl. No.: 692,534

[22] Filed: Aug. 6, 1996

[30] Foreign Application Priority Data

Aug. 22, 1995 [KR] Rep. of Korea ............... 25944/1995

[51] Int. Cl.⁶ ........................................... H01L 21/441
[52] U.S. Cl. .......................... 438/570; 438/670; 438/950
[58] Field of Search ............................... 437/175, 176, 437/177, 178, 179, 944, 184, 229, 912; 148/DIG. 100

[56] References Cited

U.S. PATENT DOCUMENTS

| | | | |
|---|---|---|---|
| 5,266,526 | 11/1993 | Aoyama et al. | 437/944 |
| 5,288,654 | 2/1994 | Kasai et al. | 437/944 |
| 5,358,885 | 10/1994 | Oku et al. | 437/912 |
| 5,496,748 | 3/1996 | Hattori et al. | 437/175 |

FOREIGN PATENT DOCUMENTS 0265140  3/1990  Japan ........................... 437/944

*Primary Examiner*—Michael Trinh
*Attorney, Agent, or Firm*—John P. White

[57] ABSTRACT

Method for fabricating a semiconductor device is disclosed, including the steps of: forming a first resist layer on a substrate; patterning a predetermined region of the first resist layer to form a pattern having a first width which exposes the substrate; forming an insulating film on an entire surface of the substrate including the first resist layer; forming a second resist layer on the insulating film; patterning a predetermined region of the second resist layer to form a pattern over the pattern of the first resist layer having a second width which exposes the insulating film; using the second resist layer as a mask in etching the exposed insulating film to form sidewall spacers at sides of the pattern of the first resist layer; forming a metal layer on an entire resultant surface including the second photoresist layer; and, removing the first and second resist layers and the insulating film to form a T form gate electrode.

10 Claims, 4 Drawing Sheets

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device.

2. Discussion of the Related Art

In order to increase an operation frequency of a device, it is in general required to shorten a length of a gate in a semiconductor device. However, further shortening of the gate length which is about 1 µm causes a gate resistance to increase due to a smaller aspect ratio. Therefore, in order to prevent increase of the gate resistance while shortening the gate length further, a method in which a section of the gate is formed to have a T form is mostly used.

A conventional method for fabricating a semiconductor device will be explained with reference to the attached drawings. FIGS. 1a and 1b illustrate sections showing one example of the steps of the conventional method for fabricating the T form gate.

Referring to FIG. 1a, first, second and third resists 2, 3 and 4 are formed in succession on a substrate 1, and predetermined regions of which are selectively exposed. The first and third resists are formed of materials of which expose sensitivities are the same, and the second resist is formed of a material of which expose sensitivity is higher than the expose sensitivities of the first and third resists 2 and 4. That is, the second resist 3 is formed of a resist which can cause an exposure with a little dose.

Referring to FIG. 1b, the first, second and third resists are selectively developed to form resist patterns. In this time, the second resist 3, of which expose sensitivity is higher than the expose sensitivities of the first and third resists 2 and 4, is developed more in terms of region. On an entire resultant surface having the resist patterns formed thus, a metal is deposited and subjected to a lift off process to form the T form gate electrode.

FIGS. 2a–2c illustrate sections showing another example of the steps of the conventional method for fabricating the T form gate.

Referring to FIG. 2a, first and second resists 11 and 12 are formed on a substrate 10 in succession, and predetermined regions of which are exposed for the first time to a width of about 0.1. µm each. The first resist 11 has an expose sensitivity that is higher than the expose sensitivity of the second resist 12.

Referring to FIG. 2b, the first and second resists 11 and 12 are exposed for the second time to a width of about 1 µm each including the regions which were exposed for the first time. As shown in FIG. 2c, the exposed first and second resists 11 and 12 are developed to form resist patterns. On an entire resultant surface of the substrate having the resist patterns formed thereon, a metal is deposited and subjected to a lift off process to form the T form gate electrode.

However, the aforementioned conventional method for fabricating a semiconductor device has the following problems.

The obtaining of a gate length of 0.1 µm from two or three layered resists having a total thickness of about 6000Å~7000 Å makes the fabrication process and its reproducibility difficult.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method for fabricating a semiconductor device which can improve a reproducibility of the fabrication process and can reduce length and resistance of a gate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of forming a first resist layer on a substrate, patterning a predetermined region of the first resist layer to form a pattern having a first width which exposes the substrate, forming an insulating film on an entire surface of the substrate including the first resist layer, forming a second resist layer on the insulating film, patterning a predetermined region of the second resist layer to form a pattern over the pattern of the first resist layer having a second width which exposes the insulating film, using the second resist layer as a mask in etching the exposed insulating film to form sidewall spacers at sides of the pattern of the first resist layer, forming a metal layer on an entire resultant surface including the second photoresist layer, and removing the first and second resist layers and the insulating film to form a T form gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENT

Reference will now be made in detail to the preferred embodiment of the present invention, an example of which is illustrated in the accompanying drawings.

Figure 3A:
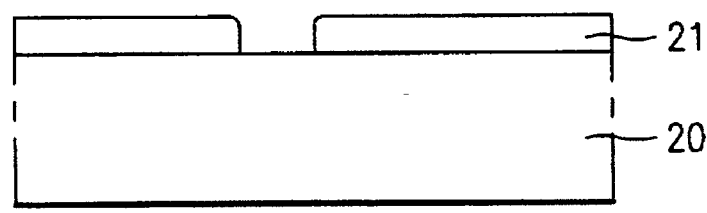
Figure 3B:
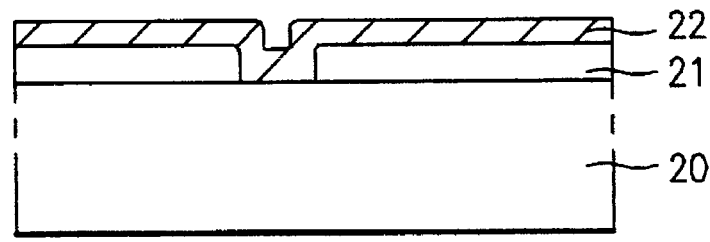
Figure 3C:
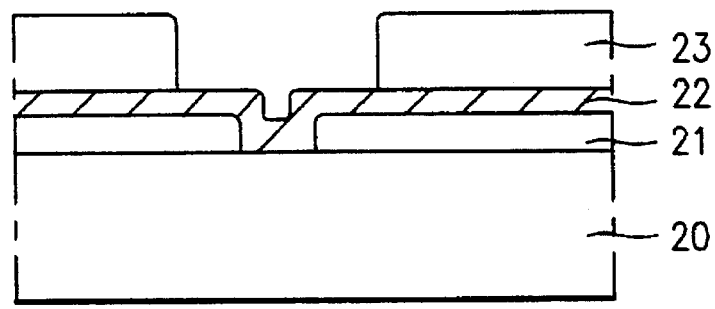
Figure 3D:
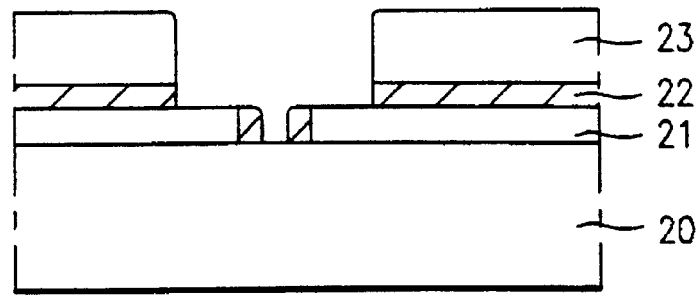
Figure 3E:
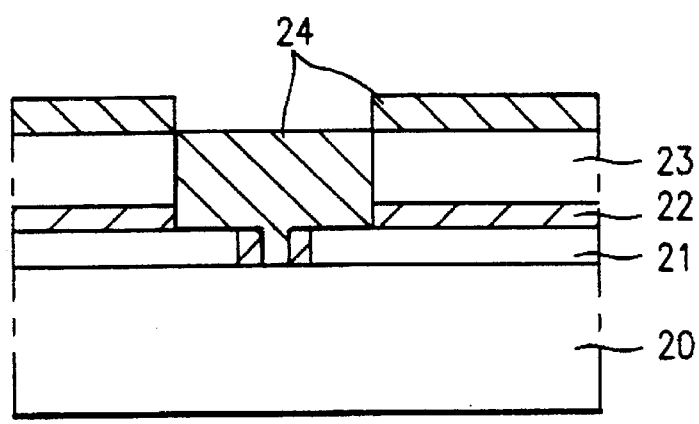
Figure 3F:
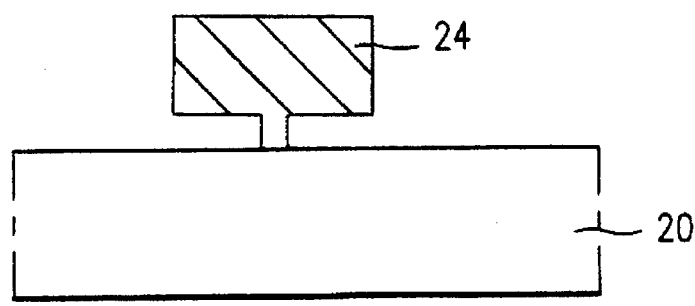

FIGS. 3a and 3f illustrate sections showing the steps of a method for fabricating a T form gate in accordance with one preferred embodiment of the present invention.

Figure 1A:
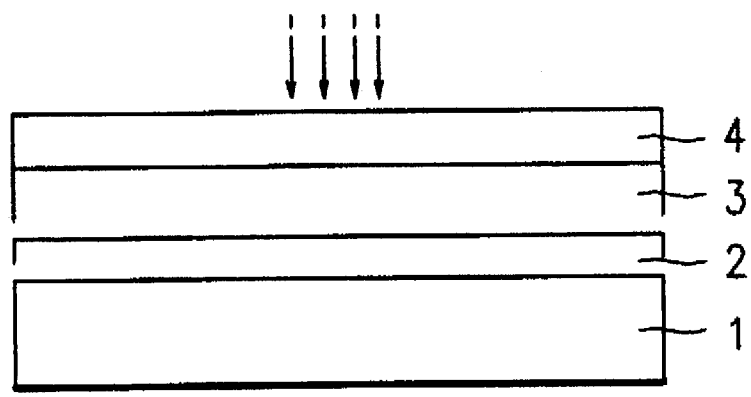
FIGS. 1a and 1b illustrate sections showing one example of the steps of a conventional method for fabricating a T form gate.
Figure 1B:
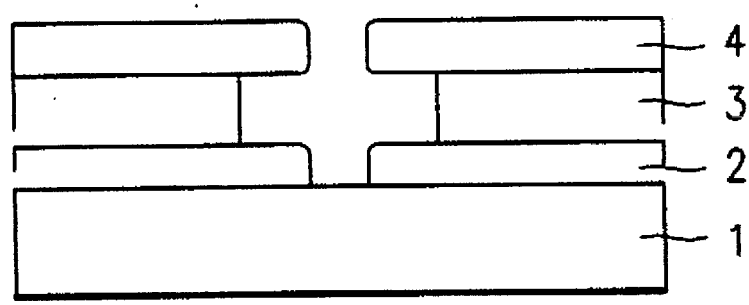
Figure 2A:
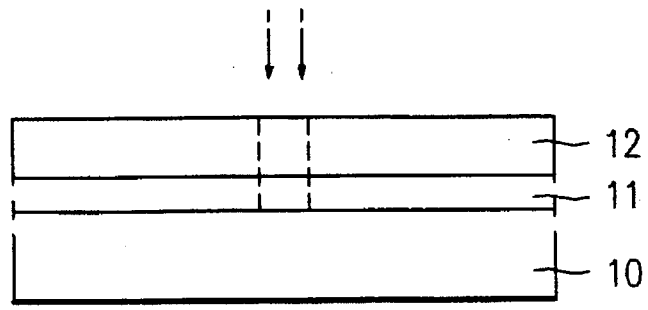
FIGS. 2a to 2c illustrate sections showing another example oft he steps of a conventional method for fabricating a T form gate; and, FIGS. 3a to 3f illustrate sections showing the steps of a method for fabricating a T form gate in accordance with one preferred embodiment of the present invention.
Figure 2B:
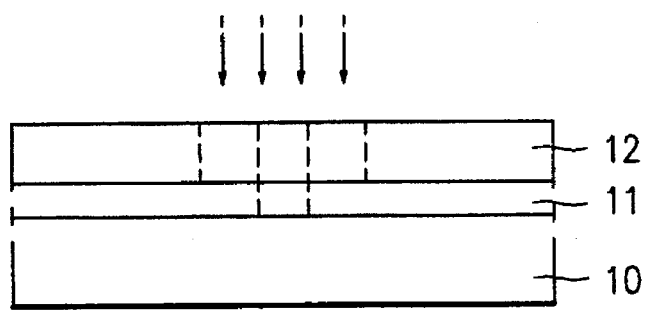
Figure 2C:
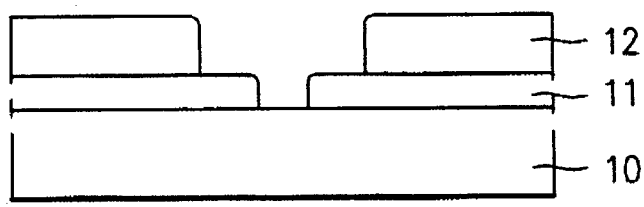

Referring to FIG. 1a, a first resist layer 21 is formed on a substrate 20 to a thickness of 500~2000 Å, and an electron beam is used in exposing and developing a predetermined region of the first resist layer 21 to form a pattern having a width of 0.1~0.3 μm which exposes the substrate 20. The first resist layer 21 is formed of PMMA.

Referring to FIG. 3b, an insulating film 22 is formed on an entire surface of the substrate 20 including the insulating film 22 to a thickness of 200~800 Å. The insulating film is formed of $Si_3N_4$ by PECVD (Plasma Enhanced Chemical Vapor Deposition). The reason of forming the insulating film 22 is to prevent the first resist layer 21 from being affected from a developer for a second resist layer 23.

Referring to FIG. 3c, a second resist layer 23 is formed on the insulating film 22 to a thickness of 0.5~2 μm, and the second resist layer 23 is subjected to UV lithography to pattern a predetermined region thereof to form a pattern having a width of 1 μm~2 μm which exposes the insulating film 22 over the first resist layer 21.

Referring to FIG. 3d, the second resist layer 23 is used as a mask in etching the exposed insulating film 22 to leave side spacers only on sides of the pattern of the first resist layer 21. The pattern width of the first resist layer 21 is reduced to a width of 0.1 μm due to the side spacers of the insulating film 22.

Referring to FIG. 3e, a metal layer is formed on an entire surface of the substrate 20 including the second resist layer 23.

Referring to FIG. 3f, the first and second resist layer 21 and 23 and the insulating film 22 are removed by a lift-off process, resulting to form the T form gate electrode 24.

As has been explained, the method for fabricating a semiconductor device in accordance with the present invention has the following advantages.

First, in case a gate electrode of about 0.1 μm tenth is formed, since a pattern for the length of the gate electrode can be formed to a width of 0.2 μm by using an electron beam, which provides relatively greater allowance, control of the fabrication process is easy.

Second, since the top width and the top thickness of the T form gate electrode can be increased by more than 1 μm each, a gate resistance can be reduced.

Third, the formation of the sidewall spacers at sides of the pattern of the first resist layer can lead to a significant reduction of the length of the gate electrode.

It will be apparent to those skilled in the art that various modifications and variations can be made in method for fabricating semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device comprising the steps of:

forming a first resist layer on a substrate;

patterning a predetermined region of the first resist layer to form a pattern having a first width which exposes the substrate;

forming an insulating film on an entire surface of the substrate including the first resist layer;

forming a second resist layer on the insulating film;

patterning a predetermined region of the second resist layer to form a pattern over the pattern of the first resist layer having a second width which exposes the insulating film;

using the second resist layer as a mask in etching the exposed insulating film to form sidewall spacers at sides of the pattern of the first resist layer;

forming a metal layer on an entire resultant surface including the second photoresist layer; and, removing the first and second resist layers and the insulating film to form a T form gate electrode.

2. A method as claimed in claim 1, wherein the first resist layer is formed of PMMA.

3. A method as claimed in claim 1, wherein the first resist layer is formed to a thickness of 500~2000 Å.

4. A method as claimed in claim 1, wherein an electron beam is used in patterning the first resist layer.

5. A method as claimed in claim 1, wherein a pattern width of the first resist is formed to be at least 0.1~0.3 μm.

6. A method as claimed in claim 1, wherein the insulating film is formed to a thickness of 200~800 Å.

7. A method as claimed in claim 1, wherein the insulating film is formed of $Si_3N_4$.

8. A method as claimed in claim 1, wherein the second resist layer is formed to a thickness of 0.5~2 μm.

9. A method as claimed in claim 1, wherein an ultra-violet ray is used in patterning the second resist layer.

10. A method as claimed in claim 1, wherein the second resist is formed to have a pattern width of about 1 μm~2 μm.

* * * * *